United States Patent
Kaneko

(10) Patent No.: US 8,188,362 B2
(45) Date of Patent: May 29, 2012

(54) PHOTOPHYSICOCHEMICAL CELL

(75) Inventor: Masao Kaneko, Mito (JP)

(73) Assignee: Ibaraki University, Mito-shi (JP)

( * ) Notice: Subject to any disclaimer, the term of this patent is extended or adjusted under 35 U.S.C. 154(b) by 966 days.

(21) Appl. No.: 11/817,843

(22) PCT Filed: Mar. 9, 2006

(86) PCT No.: PCT/JP2006/305185
§ 371 (c)(1),
(2), (4) Date: Sep. 5, 2007

(87) PCT Pub. No.: WO2006/095916
PCT Pub. Date: Sep. 14, 2006

(65) Prior Publication Data
US 2009/0050193 A1    Feb. 26, 2009

(30) Foreign Application Priority Data
Mar. 10, 2005    (JP) .................... 2005-067183

(51) Int. Cl.
*H01L 31/00*    (2006.01)

(52) U.S. Cl. ................................ 136/248

(58) Field of Classification Search ........... 136/243–265
See application file for complete search history.

(56) References Cited

U.S. PATENT DOCUMENTS
5,932,111 A * 8/1999 Christensen et al. ..... 210/748.11
2005/0166960 A1 * 8/2005 Jin et al. .................... 136/263

FOREIGN PATENT DOCUMENTS
| JP | 59-165379 | 9/1984 |
| JP | 61-158674 | 7/1986 |
| JP | 62-56588 | 3/1987 |
| JP | 4-342964 | 11/1992 |
| JP | 9-259942 | 10/1997 |

OTHER PUBLICATIONS

PTO English translation of JP 59-165379, Jul. 2010.*
Crandall, Electrical conduction in n-type cadmium sulfide at low temperatures, Physical Review, vol. 169, No. 3, pp. 577-584, May 15, 1968.*
Gratzel, Photoelectrochemical cells, Nature, vol. 414, pp. 338-344, Nov. 15, 2001.*
M. Kaneko, et al., "Artificial photochemical nitrogen cycle to produce nitrogen and hydrogen from ammonia by platinized $TiO_2$ and its application to a photofuel cell", Chemical Communication, No. 12, Mar. 28, 2005, pp. 1625-1627.

* cited by examiner

*Primary Examiner* — Jessica L Ward
*Assistant Examiner* — Kevin E Yoon
(74) *Attorney, Agent, or Firm* — Oblon, Spivak, McClelland, Maier & Neustadt, L.L.P.

(57) ABSTRACT

The present invention provides photophysicochemical cell which comprises, as the photoanode electrode (a) an electrode formed of a porous semiconductor material which, under ultraviolet irradiation condition, is photo-excited and functions as a porous electrically conductive material in an ultraviolet region, or (b) the porous semiconductor material capable of functioning as an ultraviolet-region electrically conductive material is selected from the group consisting of titanium dioxide, zinc oxide, tin dioxide, tungsten oxide, and silicon carbide, and (c) the porous semiconductor material which constitutes the photoanode electrode capable of functioning as an ultraviolet-region electrically conductive material has large effective surface area of some hundreds times to thousands times the apparent surface area of the electrode.

21 Claims, 1 Drawing Sheet

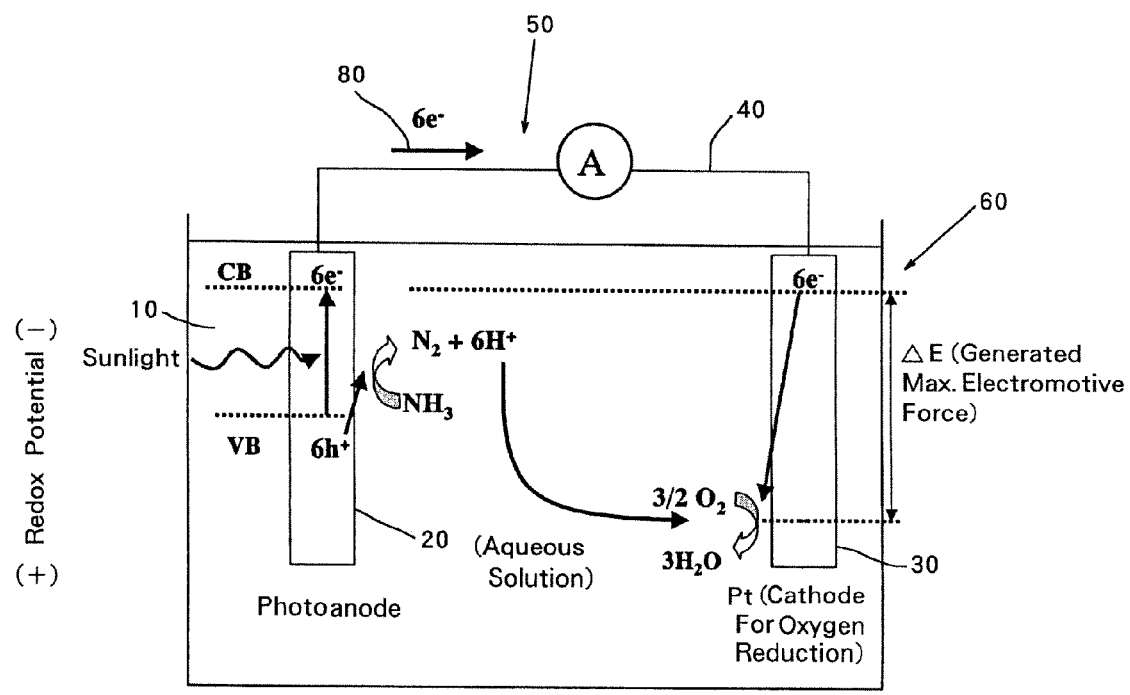

PHOTOPHYSICOCHEMICAL CELL

TECHNICAL FIELD

The present invention relates to a method of highly efficiently generating photoelectric current and a photophysicochemical cell. More specifically, it relates to a photoelectric current generating method in which a specific photoanode is inserted in a liquid phase medium that is a solution of a redox liquid or redox compound, an electrode formed of an electrically conductive material capable of reducing oxygen is further inserted as a counter cathode electrode, with oxygen being present in the above liquid phase medium and light is applied to the above anode electrode to highly efficiently generate a photoelectric current, and a highly efficient photophysicochemical cell comprising the above electrodes.

BACKGROUND ART

Global warming induced by massive emission of carbon dioxide from fossil fuel combustion and resultant or entailed phenomena such as abnormal climate, massive floods, disappearance of permanently frozen ground, unquestionable melting of glaciers, a rise in sea levels, etc., have come to take place worldwide, frequently and highly repeatedly, and the subsistence environment of the human race is rapidly deteriorating and being threatened. There are therefore strongly demanded to create new energy resources and innovative energy saving technologies for overcoming these serious problems on a global scale as urgently as possible. Wind force power generation, photovoltaic power generation using a solar cell, regenerable new energy resources using biomass, further, an energy saving system using a fuel cell, and the like are expected to be technologies to overcome them, and they are coming to be in widespread use.

However, these new energy systems still have problems in efficiency and cost for putting them to actual use on commercial bases, and it would have to be said that there is no actual technology that can realistically, greatly reducing the carbon dioxide emission. In the recently enforced Kyoto Protocol, it is not easy to attain carbon dioxide reduction numerical targets imposed on contracting countries, and in particular it is thought that the attainment of the reduction numerical target in Japan is also skeptical.

Under these circumstances, hydrogen, as an energy medium for getting human society going and moving forward, has come to attract attention as an ultimate clean medium that is combusted to produce only water without emitting any carbon dioxide. And it is much-publicized that realization of so-called hydrogen society is to come. However, hydrogen has a very low energy density and involves big problems in storage and transportation thereof. Further, it is a dangerous compound that leaks and explodes easily, and handling thereof is difficult. It is very difficult to build necessary infrastructure for storage, transportation and supply thereof, and there exist significant bottlenecks or barriers against the realization of wide commercial-base use thereof.

A so-called fuel cell is presently attracting attention for suppressing carbon dioxide emission. The reason therefor is as follows. In thermal-power generation, a power generator is turned with energy from the mere combustion of a fuel for obtaining power from the fuel. In contrast thereto, when the above fuel is reacted with oxygen in a fuel cell, the reaction is carried out at electrodes and through an external circuit generated charges here can be directly obtained as electric power.

In this case, the energy conversion efficiency from a fuel to electric power in the thermal-power generation is approximately 40%, and in the fuel cell, the above energy conversion efficiency is approximately 40 to 70% on the energy basis and the energy conversion efficiency can be increased as compared with the thermal-power generation. However, it is only hydrogen and methanol that can be generally used in the fuel cell, and for using any other fuel as a fuel in the fuel cell, it is required to convert the fuel to hydrogen once by reforming before use, which leads to a higher cost. Hydrogen gas thus is a fuel that in principle has the above various problems, and methanol is easier to handle than hydrogen and can be directly used as a fuel in the fuel cell. However, the energy conversion efficiency of methanol is not so high and is approximately 30 to 40% at the highest.

On the other hand, a solar cell using a crystalline silicon or amorphous silicon semiconductor has been materialized for converting solar energy to electric power. However, it has a problem that its power generation efficiency is low.

The present inventor has had a new and novel idea that a highly efficient photo-electric generation and photophysicochemical cell, which are capable of converting solar energy or other photo-energy to electric power, which can be used as regenerable energy resources and further which can use compounds that are not conventionally usable as fuels, can be used in society as an energy-saving power generation system that can be an alternative for conventional solar cells and fuel cells.

The above "photophysicochemical cell" is a cell system based on a new and novel concept, while there has been a proposal of one which appears to be similar to the concept of the present invention.

For example, Honda, et al. have reported the following. When a titanium dioxide electrode and a counter platinum electrode are immersed in an electrolyte aqueous solution and when light is applied to the titanium dioxide, water is electrochemically photolyzed to generate hydrogen and oxygen and in this case, photoelectric current occurs (so-called Honda-fujishima effect) (Fujishima et al., "Electrochemical Photolysis of Water at a Semiconductor Electrode", Nature, 1972, vol. 238, P37-38). In this proposed system, however, hydrogen is generated at a counter cathode, so that the photo-energy is almost all converted to hydrogen. This system is hence hardly usable as a photoelectric cell.

Further, JP 53-131445A discloses a semiconductor photo-electric cell in which sunlight is applied to a semiconductor electrode for decomposition of water. In this electric cell, hydrogen gas is generated, so that it is separated from oxygen which occurs simultaneously, and the separated hydrogen gas is once reserved in a tank of a metal hydride and hydrogen is used as a fuel to actuate a fuel cell.

In Japanese Patent Application No. 2004-379280, further, the present inventor have proposed that a nitrogen-containing compounds can be decomposed by light into nitrogen and hydrogen by a similar method. However, the above proposal intends to produce nitrogen and hydrogen, for example, by photolysis of ammonia, and the photo-energy is all converted to hydrogen energy and hence could not be taken out as an effective electric power.

In JP 59-165379A (to be sometimes referred to as "379 publication" hereinafter), its claim specifies a so-called photo-fuel cell in which an n-type semiconductor electrode and a counter electrode are placed in a solution of an organic substance having a current doubling effect, light is applied to the n-type semiconductor electrode to oxidize the organic substance and oxygen is reduced at the counter electrode to produce electric power. That is, the wording of the above claim appears to have proposed the idea of a photo-fuel cell and the photo-fuel cell appears to be known.

The entire technical content described in the 379 publication has now been studied in detail, and it has been hence found that this publication does not at all describe any means or embodiment which enables one skilled in the art to practice or make what appears to be the "photo-fuel cell" recited in the above claim nor enables to specifically materialize the same. Under the Japanese Patent Law, further, it is requested to describe Example(s) that shows how the invention of the photo-fuel cell recited in the claim is actually embodied. Nevertheless, no Examples described in the above publication provide any embodiments of the idea of the claimed photo-fuel cell. That is, the above Examples describe that a semiconductor anode electrode formed of a Cds single crystal or CdS polycrystal as an anode electrode was inserted in a sodium formate solution (fuel), a platinum black electrode was inserted in sulfuric acid and 500 nm light was applied to the above anode whereby a photoelectric current could be generated. However, these Examples were carried out under very unusual and extreme conditions wherein the solution in which the anode electrode was inserted was strongly basic (a pH of 14 or less) and the solution in which the cathode was inserted was strongly acidic (a pH of 0 or less). This corresponds to a case where a voltage of 0.82 volt or more is applied as an aid between the two electrodes. In principle, the above application of an external voltage to a solar cell, a fuel cell or specifically the above "photo-fuel cell" on purpose is almost the same as inputting of external energy to the above cell and is technically meaningless. In the cell in the above Examples, protons ($H^+$) are generated at the anode electrode and $H^+$s are used up at the cathode electrode during the electric cell reaction, so that the pH difference between the anode cell and the cathode cell gradually decreases while photo-electric current is caused to flow, and as a result, the photo-electric current comes to turn off. In addition thereto, the ion exchange membrane and the salt bridge which constitutes a partition between the anode cell and the cathode cell have a proton exchange function, so that the pH difference between the two cells decreases due to proton exchange process which proceeds while the electric cell is left as it is, and it comes to a stop to operate as a photoelectric cell.

As described above, Examples described in the 379 publication fail to show or demonstrate how the proposed "photo-fuel cell" is actually embodied.

Further, as will be shown in Referential Example 1 to be described later, when a confirmation or verification experiment of the "photo-fuel cell" specified in the claim of the 379 publication was carried out using an anode formed of CdS single crystal, naturally, this fuel cell generated almost no photoelectric current value and had no significant practical use.

The "photo-fuel cell" that is thought to be publicly known by the 379 publication is actually on such a level that it operates only when an auxiliary external energy is applied, and it has not been put into practice as a completed invention having an objective and specific constitution in which it operates and generates intended photoelectric current, without applying any external energy. Further, it also involves a problem that the fuel that can be used is limited to very few compounds "having a current double effect".

It is an object of the present invention to provide a novel photophysicochemical cell in which any fuel can be oxidatively decomposed with a photoanode without applying any one of the above auxiliary external energy, etc., and a photoelectric current can be generated by reducing oxygen at a counter cathode.

It is also another object of the present invention to provide a photophysicochemical cell capable of generating a photoelectric current by decomposing not only those limited few compounds "having a current double effect" but also a wide range of compounds that naturally include alcohols such as methanol and also include urea, ammonia, agarose, glucose, amino acid and, further, biomass such as cellulose.

DISCLOSURE OF INVENTION

A. The present invention has been made from the above viewpoint and according to the present invention, the following photoelectric current generating methods are provided.

[1] A method of generating a photoelectric current, in which a photoanode electrode is inserted in a liquid phase medium comprising a redox liquid or a solution of redox compound, and an electrode formed of an electrically conductive material capable of reducing oxygen is inserted as a counter cathode electrode, with oxygen being present in said liquid phase medium, light is applied to said photoanode electrode, thereby oxidatively photolyzing said redox liquid or redox compound at said anode electrode and oxygen is hence reduced at said counter electrode thereby generating photoelectric current, the method comprising using, as said photoanode electrode,
(a) an electrode formed of a porous electrically conductive material in an ultraviolet region, or
(b) an electrode formed of an n-type visible-region semiconductor having a carrier density of $10^{13}$ cm$^{-3}$ or more and/or a conductivity of $10^{-5}$ Scm$^{-1}$ or more,

[2] a method as recited in [1], wherein an electrode whose surface is modified with an oxidation catalyst for water is used as said photoanode electrode, and/or an oxidation catalyst for water is also present in the liquid phase medium comprising said redox liquid or said solution of said redox compound, thereby generating photoelectric current,

[3] a method as recited in [1] or [2], wherein a counter electrode whose surface is modified with a reduction catalyst for oxygen is used as said counter electrode, and/or a reduction catalyst for oxygen is also present in the liquid phase medium comprising said redox liquid or said solution of said redox compound, thereby generating photoelectric current,

[4] a method as recited in any one of [1] to [3], wherein a dyestuff sensitizer is adsorbed on said photoanode electrode, and/or a dyestuff sensitizer is also present in the liquid phase medium comprising said redox liquid or the solution of said redox compound, thereby generating photoelectric current,

[5] a method as recited in any one of [1] to [4], wherein water is used as said redox liquid to generate photoelectric current,

[6] a method as recited in any one of [1] to [4], wherein aqueous ammonia is used as said redox liquid to generate photoelectric current,

[7] a method as recited in any one of [1] to [4], wherein a solution of biomass or a derivative thereof is used as said redox liquid to generate photoelectric current,

[8] a method as recited in any one of [1] to [7], wherein porous titanium dioxide is used as porous electrically conductive material comprising said photoanode electrode, to generate photoelectric current, and

[9] a method as recited in any one of [1] to [7], wherein a gallium arsenic n-type semiconductor is used as an n-type visible-region semiconductor comprising said photoanode electrode, to generate photoelectric current.

B. According to the present invention, further, the following photophysicochemical cells are provided.

[10] A photophysicochemical cell comprising a liquid phase medium comprising a redox liquid or a solution of a redox compound, a photoanode electrode inserted in the liquid phase medium, an electrode formed of an electrically conductive material capable of reducing oxygen, comprising a counter electrode inserted in the liquid phase medium and an external circuit connecting said anode electrode and said counter cathode electrode with an external conducting wire, and having a constitution in which oxygen is also being present in said liquid phase medium, light is applied to said photoanode electrode thereby oxidatively photolyzing said redox liquid or redox compound at said anode electrode and oxygen is thereby reduced at said counter electrode thereby generating photoelectric current in said external circuit, wherein the photophysicochemical cell uses, as said photoanode electrode, (a) an electrode formed of a porous electrically conductive material in an ultraviolet region, or (b) an electrode formed of an n-type visible-region semiconductor having a carrier density of $10^{13}$ cm$^{-3}$ or more and/or a conductivity of $10^{-5}$ Scm$^{-1}$ or more,

[11] a photophysicochemical cell as recited in [10], wherein an electrode whose surface is modified with an oxidation catalyst for water is used as said photoanode electrode and/or an oxidation catalyst for water is also being present in the liquid phase medium comprising said redox liquid or said solution of said redox compound, thereby generating photoelectric current,

[12] a photophysicochemical cell as recited in [10] or [11], wherein a counter electrode whose surface is modified with a reduction catalyst for oxygen is used as said counter electrode and/or a reduction catalyst for oxygen is also being present in the liquid phase medium comprising the redox liquid or said solution of the redox compound, thereby generating photoelectric current,

[13] a photophysicochemical cell as recited in any one of [10] to [12], wherein a dyestuff sensitizer is adsorbed on said photoanode electrode and/or a dyestuff sensitizer is being present in the liquid phase medium comprising said redox liquid or said solution of said redox compound, thereby generating photoelectric current,

[14] a photophysicochemical cell as recited in any one of [10] to [13], wherein water is used as said redox liquid to generate photoelectric current,

[15] a photophysicochemical cell as recited in any one of [10] to [13], wherein aqueous ammonia is used as said redox liquid to generate photoelectric current,

[16] a photophysicochemical cell recited in any one of [10] to [13], wherein a solution of biomass or a derivative thereof is used as said redox liquid to generate a photoelectric current,

[17] a photophysicochemical cell as recited in any one of [10] to [16], wherein porous titanium dioxide is used as a porous electrically conductive material comprising said photoanode electrode, to generate a photoelectric current, and

[18] a photophysicochemical cell recited in any one of [10] to [16], wherein a gallium arsenic n-type semiconductor is used as an n-type visible-region semiconductor comprising said photoanode electrode, to generate a photoelectric current.

BRIEF DESCRIPTION OF DRAWINGS

FIG. 1 is a FIGURE for explaining the constitution of the photophysicochemical cell of the present invention.

BEST MODES FOR CARRYING OUT THE INVENTION

The present invention will be explained in detail hereinafter.

(Generation of Photoelectric Current and Photophysico-Chemical Cell)

One embodiment of operation of the photophysicochemical cell according to the present invention will be explained with reference to the drawings.

FIG. 1 shows one embodiment of the photophysicochemical cell of the present invention. The embodiment is a photophysicochemical cell 60 in which aqueous ammonia for example is used as a solution of a redox liquid or redox compound (i.e., a solution of a fuel), (a) a porous electrically conductive electrode in an ultraviolet region or (b) an electrode formed of an n-type visible-region semiconductor having a carrier density of $10^{13}$ cm$^{-3}$ or more and/or an electric conductivity of $10^{-5}$ Scm$^{-1}$ or more is, as a photoanode electrode 20, inserted in the liquid phase medium 10 such as an aqueous medium containing the above fuel, and an electrically conductive electrode capable of reducing oxygen, such as a counter electrode formed of platinum or the like, is further inserted as a oxygen redictopm cathode electrode 30, the above anode electrode 20 and the cathode electrode 30 are connected with an external conducting wire 40 to constitute an external circuit 50, and oxygen is also being present in the above liquid phase medium.

When light such as sunlight is applied or irradiated to the above photoanode electrode, electrons (e$^-$) are photoexcited from the valance band (VB) of the anode to the conduction band (CB) and holes (h$^+$) formed and remain in the above valance band as shown in the FIGURE. These holes oxidatively decompose the fuel such as ammonia (NH$_3$) to generate nitrogen (N$_2$) and protons (H$^+$).

On the other hand, the excited electrons (e$^-$) transfer or move to reach a counter electrode of cathode platinum or the like through an external circuit (that is, photoelectric current (in the direction opposite to the direction of an arrow 80) is generated in the external circuit). At the counter electrode, the electrons (e$^-$) reduce oxygen that is also being present in the above liquid phase medium, to generate water (In this case, protons (H$^+$) also take part in this reaction).

In the above manner, the redox liquid or redox compound (fuel) such as ammonia, etc., reacts with oxygen which is also being present (dissolved) in the liquid phase medium by the assistance of applied light and through the external circuit, to generate nitrogen and water. That is, according to the photophysicochemical cell of the present invention, non-combustible compounds such as ammonia, etc., and even water and the like, which are not usable in any conventional-type fuel cells, can be decomposed by activation with applied or irradiated light, and thus they can be used as a fuel in the photophysicochemical cell. That is, according to the photophysicochemical cell of the present invention, there can be constituted a fuel cell that generates photoelectric current directly without producing hydrogen once, nor going through and utilizing hydrogen.

In the above photophysicochemical cell, it is effective to use of an oxidation catalyst in combination with the above anode electrode for promoting the photolysis of the redox compound. With regard to light to be applied, further, use of a sensitizer together with the above semiconductor electrode is as well preferred for making efficient use of visible-region light that covers approximately half of the sunlight spectra. Further, a reduction catalyst for oxygen is used in combination with the above counter electrode for carrying out efficiently the reduction of oxygen at the counter electrode, thereby leading to a further preferred result. The present invention will be explained further in detail.

(Photoanode Electrode)

In the present invention, the electrode that can be used as a photoanode electrode is (a) a porous electrically conductive electrode in an ultraviolet region, or (b) an n-type visible-region semiconductor having a carrier density of $10^{13}$ cm$^{-3}$ or more and/or a conductivity of $10^{-5}$ Scm$^{-1}$ or more.

As the (a) porous electrically conductive electrode in an ultraviolet region, titanium dioxide gives an excellent result, and besides this, porous ultraviolet-region electrically conductive materials such as zinc oxide, tin dioxide, tungsten oxide, silicon carbide, etc., are also used. For increasing the contact area of the photoanode/liquid phase where a photoelectrochemical reaction takes place, it is preferable to use a porous material having a remarkably large effective surface area.

These ultraviolet-region electrically conductive materials are semiconductor materials per se and are not electrically conductive materials per se. Since, however, they are constituted as a porous material having the above large effective surface area, this effective surface area is some hundreds times to thousands times the apparent surface of the electrode, thus in the application of ultraviolet light, a great number of electrons are injected from the liquid phase, which produces a result equivalent to the presence of a great number of carrier electrons inside. That is, these ultraviolet-region porous electrically conductive materials behave like an electrically conductive material under the ultraviolet irradiation condition.

Further, for the (b) n-type visible-region semiconductor having a carrier density of $10^{13}$ cm$^{-3}$ or more and/or a conductivity of $10^{-5}$ Scm$^{-1}$ or more, n-type visible-region semiconductor materials such as silicon, gallium arsenic, strontium titanate, cadmium selenide, gallium phosphide, etc., can be used as a photoanode electrode. More preferably, an n-type visible-region semiconductor having a carrier density of $10^{16}$ cm$^{-3}$ or more and/or a conductivity of $10^{-2}$ Scm$^{-1}$ or more is used.

In the photophysicochemical cell of the present invention, when light is applied to the photoanode, electrons are excited from the valence band thereof to the conduction band, holes remain in the above valence band, and these holes decompose a fuel such as ammonia by oxidation to generate nitrogen and protons (H$^+$). When an electrode of a conventional general semiconductor is to be used in this case, holes generated by the application of light melt or dissolve this semiconductor electrode, thus such electrode has not been so far used. While it is described in the 379 publication that CdS is the most preferred as an anode in the so-called photo-fuel cell, the single crystal thereof has a conductivity of as low as approximately $10^{-7}$ Scm$^{-1}$. CdS therefore does not come under any of the above requirements (a) and (b) and cannot be used in the photophysicochemical cell of the present invention.

Further, the anode material can be used in various forms such as a single crystal, a polycrystal, an amorphous material, and the like. For forming a porous electrode in the (a), preferably, for example, a powder of a semiconductor (electrically conductive) material is applied on a substrate formed of an electrically conductive material and then the applied powder is sintered to form a porous semiconductor film. As a material for the transparent electrically conductive substrate, various materials such as a transparent electrically conductive glass (ITO, etc.), a metal, a metal thin film, carbon, etc., can be used. Further, the electrically conductive glass for the above substrate may suffer decreased in conductivity due to heating during sintering procedure after the application. In this case, a material doped with fluorine is preferably used to mitigate the decrease in conductivity.

(Counter Cathode Electrode)

In the present invention, the counter cathode electrode is not specially limited so long as it can reduce oxygen. For example, it can be selected from platinum, silver oxide, carbon, porous carbon, graphite, an electrode obtained by mixing and compressing any composition of these, a transparent electrically conductive glass, an electrode of any one of these which support platinum fine particles, a platinum black electrode, and the like. In essence, any electrode capable of reducing oxygen can be used without any special limitation.

With the above counter electrode, what is important is how to efficiently reduce oxygen, and it hence produces a superior result when the electrode is modified, on the surface thereof, with a reduction catalyst for oxygen such as a metal complex, or said reduction catalyst is used while it is kept in a liquid. (Redox Liquid, Etc.)

As the redox liquid or redox compound in the present invention, a liquid fuel or a solution of a fuel (to be also referred to as "liquid fuel, etc.") is used, and it is used in the form of a liquid phase medium. Concerning the above liquid fuel, etc., in particular water per se can be used as a fuel. Moreover, the liquid fuel, etc., include ammonia, urea, alcohols (methanol, ethanol, isopropanol, higher alcohols such as butanol, hexanol, heptanol, etc., glycerin, polyethylene glycol, polypropylene glycol, etc.), hydrocarbons (methane, ethane, propane, butane, pentane, hexane, benzene, toluene, xylene, aniline, anthracene, etc.), other organic compounds (organic acids such as formic acid, acetic acid, propionic acid, butyric acid, caproic acid, acrylic acid, crotonic acid, oleic acid, etc., esters, ketones and ethers of these acids, amines such as methylamine, ethylamine, etc., acid amide, phenylalanine, glutamic acid, aspartic acid, glycin, tyrosine, etc.) saccharide (glucose, sucrose), polysaccharide, inorganic compounds (metal salt, etc.). Any of these compounds can be used so long as they work as an electron donor to the anode electrode. Of these, any compounds other than water can be used in the form of an aqueous solution or other solution each. In addition, when an inorganic electrolyte such as $Na_2SO_4$, NaOH or the like or an organic electrolyte is introduced into and kept in the liquid phase medium containing the liquid fuel, etc., the conductivity of the liquid phase medium increases, thereby improvement of the conversion efficiency can thus made. Further, it is also preferred to introduce a reduction catalyst for oxygen to be present in the above liquid phase medium.

Further, the fuel for the present cell can be selected from human and animal excrements or wasts (livestock excrements, sewage, factory waters and kitchen waste). Furthermore, it can be selected from solids, slurries or solutions of various biomasses such as wood, plant leaves and stalks, cellulose, lignin, other polysaccharides (glucose, carrageenan, starch, cellulose, chitin, chitosan, etc.), proteins (gelatin, collagen, etc.) and the like.

(Oxygen)

In the photophysicochemical cell of the present invention, the active substance at the counter cathode electrode is an electron acceptor typified by oxygen, so that it is conditional on the presence of oxygen or an electron acceptor, which is kept or contained (generally, present as dissolved oxygen) in the above liquid phase medium. As the above oxygen, in principle, oxygen under one atmospheric pressure can be used, while an oxygen containing gas mixture such as air can be also used. When the oxygen pressure in the above cell is increased to be one atmospheric pressure or more, the concentration of dissolved oxygen in the liquid phase medium increases, thereby the photophysicochemical cell is improved in performances. As oxygen, pure oxygen gas may be supplied as it is or after diluted by nitrogen gas etc. to any concentration, or a compound that is decomposed to generate oxygen (e.g., sodium percarbonate) may be introduced to be present in the liquid phase medium. Further, when air is used, it is preferably used as an oxygen-enriched gas having an oxygen concentration increased with a system using a molecular-sieve-like adsorbent such as zeolite or an oxygen-enriching membrane.

(Light to be Applied)

In the present invention, it is preferred to use sunlight from the viewpoint of the creation of regenerable energy resources, while any other light such as an artificial light source can be also used. For example, when water is used as a redox agent (fuel), theoretically, it is required to apply a light energy of at least 1.23 eV, which corresponds to light having a wavelength of approximately 1,000 nm or less. When ammonia is used as a redox agent (fuel), theoretically, it is sufficient to apply light energy of at least 0.057 eV or more, which corresponds to an electromagnetic wave having a wavelength of approximately 20 μm (infrared region) or less.

With regard to the above difference in the light (electromagnetic wave) energy required for activating fuels (redox compounds) for use in the present invention, a case using water as a fuel and a case using an ammonia fuel will be compared. When water is used as a fuel, a relatively large energy is required for activation thereof since water is very poor in electron-donating property. When ammonia is used as a fuel, a small energy is enough for the activation thereof since the electron-donating property thereof is nearly as large as that of hydrogen.

In the present invention, for using and converting the solar energy as effectively as possible, it is preferred to use light in the range of a visible light region to an infrared region, which light accounts for a larger proportion of the solar spectrum. When an artificial light source is used, any light source can be used so long as it generates an electromagnetic wave capable of activating a fuel. There can be suitably used any one of a general visible light source, a xenon lamp, a halogen lamp (incandescent lamp), a tungsten lamp, a lamp for illumination, a mercury lamp, (high-pressure, ultrahigh-pressure), ultraviolet light source, an infrared light source, a high-frequency electromagnetic wave, and the like.

(Oxidation Catalyst)

In the present invention, the photoanode electrode is preferably used, having the surface modified with an oxidation catalyst for water, since an excellent result can be obtained when water per se is used as a redox liquid (fuel). The above oxidation catalyst for water is suitably selected from metals such as platinum, ruthenium, iridium, manganese, etc., oxides of these, or a metal complex of ruthenium, manganese, copper or the like with an ammonia or polypyridine ligand, porphyrin, phthalocyanine, etc. These metal complexes have high catalytic activity and give excellent results, and an amine complex of ruthenium or copper has high activity and is preferred. Further, it is also preferred to have the above oxidation catalyst kept or be present in the liquid phase medium as will be also described in Examples later.

In addition, more specifically, the oxidation catalyst for water can be selected from various catalysts that present inventor has proposed (for example, see JP 8-243400A, JP 8-269762A, JP 9-234374A, etc.).

(Reduction Catalyst)

In the present invention, preferably, as a reduction catalyst for oxygen, which is used for modifying the counter cathode electrode, the above oxidation catalyst for water can be used as it is. Further, porphyrin, metal complexes such as phthalocyanine, etc., can be also used, and these give excellent results.

(Sensitizer)

In the present invention, when an ultraviolet-region material such as a porous electrically conductive material in an ultraviolet region is used as a photoanode electrode, it is preferred to apply ultraviolet light. For making it possible to use visible light as well, preferably, a sensitizer is adsorbed on the photoanode, or the sensitizer is introduced and kept in the above liquid phase medium comprising the above redox compound liquid or the above solution of the redox compound. As the sensitizer, an organic or inorganic dyestuff sensitizer is generally used. For example, various metal complexes of ruthenium, iridium, or the like with polypyridine give excellent results as a sensitizer. In particular a bis- or tris(bipyridine derivative ligand) ruthenium complex has high activity and is hence preferred as will be shown in Example to be described later.

(Operation Temperature)

The operation temperature of the photophysicochemical cell of the present invention can be generally room temperature. It is generally in the range of −40 to 300° C. and when it is in the range of −20 to 80° C., excellent results can be obtained.

EXAMPLES

The present invention will be specifically explained below with reference to Examples, while the technical scope of the present invention shall not be limited to these Examples. M stands for a molar concentration (moldm$^{-3}$). In Examples, except for the following Referential Example, photocell performances were measured without applying a voltage.

REFERENTIAL EXAMPLE

This Referential Example is to test a so-called photo-fuel cell specified in the claim of the 379 publication and shows that this photo-fuel cell is in principle not so specifically embodied and objectively constituted as to produce any intended effect and has not much significant, practical use.

(1) A commercially available cadmium sulfide (CdS) single crystal (low conductivity of $10^{-7}$ cm$^{-1}$), which was cut at right angle with C axis, was provided as an anode electrode and inserted in an aqueous solution containing 23 M formic acid (HCOOH) and 0.1 M sodium sulfate as an electrolyte. Platinum (area of at least 1 cm$^2$) was inserted as a counter cathode electrode, the anode electrode and the cathode electrode were connected with a wire to form an external circuit, whereby a cell was constituted.

(2) In an oxygen atmosphere having 1 atmospheric pressure, visible light (intensity: 18.4 mWcm$^{-2}$) was applied or irradiated to the anode electrode from a xenon lamp. Almost no short-circuit current was generated in the external circuit connecting the anode and the cathode. That is, it has been ascertained that the photo-fuel cell described in the claim of the 379 publication does not operate as a photocell.

(3) In this connection, a silver-silver chloride reference electrode was inserted in the cell in the above experiment and a voltage of 0.8V was applied to the anode. Only under this condition, a short-circuit current of 1 mAcm$^{-2}$ was obtained. That is, it has been ascertained and confirmed that the photo-fuel cell described in the 379 publication generates photocurrent only when a chemical potential described in its Examples (equivalent to an applied voltage of approximately 0.8 V) is applied. The above photo-fuel cell that generates photocurrent only when a voltage is applied fails to constitute any complete invention itself and has not much practical significance.

Example 1

(1) Nano-particles of titanium dioxide, acetylacetone and a surfactant are fully kneaded to prepare a paste and the paste is applied onto an electrically conductive glass, followed by calcining at 100° C. The steps of the application and the calcining were repeated, and final calcining was carried out at 450° C. for 30 minutes to form a porous film (a thickness of approximately 10 μm and an area of 1 cm$^2$) on the above electrically conductive glass, whereby forming an anode electrode. This porous film is estimated to have a roughness factor (a ratio of an actual semiconductor-liquid interfacial area to an apparent electrode area) of approximately 1,000.

(2) The above electrode and a counter electrode formed of a platinum plate coated with platinum black were immersed in 5 ml of an aqueous solution (aqueous liquid phase medium) containing 10 M ammonia and 0.1 M $Na_2SO_4$ dissolved therein (pH 14) to form a cell system, and oxygen gas was blown into it for ten minutes to substitute the inside of the system with oxygen. Then, the above two electrodes were connected with a wire to form an external circuit, whereby an electric cell was formed.

(3) Light (ultraviolet light) from a xenon lamp was applied to the titanium dioxide surface that constituted the semiconductor electrode of the above electric cell, to generate photoelectric current in the external circuit. The thus-obtained system showed an open photoelectromotive force (Voc) of 0.75 V, a short-circuit photoelectric current density (Jsc) of 650 μAcm$^{-2}$, a fill factor (FF) of 0.65 and an output (Wout) (Voc×Jsc×FF), as a photophysicochemical cell, of 317 μWcm$^{-2}$. Further, when monochromatic light of 340 nm (1.47 mWcm$^{-2}$) was used in the system, 19% of applied light quantum (light photon) was used effectively to generate photoelectric current.

Example 2

The experiment in Example 1 was carried out in the same manner as in Example 1 except that air was introduced and kept in the medium instead of blowing oxygen into it, to generate photoelectric current in the external circuit. The thus-obtained system showed an open photoelectromotive force (Voc) of 0.7 V, a short-circuit photoelectric current density (Jsc) of approximately 300 μAcm$^{-2}$, a fill factor (FF) of 0.4 and an output (Wout) (Voc×Jsc×FF), as a photophysicochemical cell, of 84 μWcm$^{-2}$.

Comparative Example 1

When Example 1 was repeated except that argon gas was blown into the medium to form a completely oxygen-free condition in place of blowing oxygen into the medium, the generation of hydrogen was found, while the system did not at all operate as a fuel cell.

Example 3

The experiment in Example 1 was carried out in the same manner as in Example 1 except that Ru-red ([$(NH_3)_5Ru$—O—$Ru(NH_3)_4$—O—$Ru(NH_3)_5$]$^{6+}$) was introduced to be kept in the water as an oxidation catalyst for water without using ammonia, to give nearly the same results.

Example 4

The experiment in Example 3 was carried out in the same manner as in Example 3 except that on the titanium dioxide porous film was adsorbed tris(4,4'-dicarboxy-2,2'-bipyridine) ruthenium (II) complex as a sensitizer together with Ru-red from an aqueous solution thereof, to give nearly the same results.

Example 5

The experiment in Example 1 was carried out in the same manner as in Example 1 except that the aqueous ammonia was replaced with a methanol aqueous solution (methanol:water=1:1 by volume ratio) and that direct sunlight was used as a light source, to generate photoelectric current in the external circuit. The thus-obtained system showed an open photoelectromotive force (Voc) of 0.7 V, a short-circuit photoelectric current density (Jsc) of approximately 2 mAcm$^{-2}$, a fill factor (FF) of 0.6 and an output (Wout) (Voc×Jsc×FF), as a photophysicochemical cell, of 840 μWcm$^{-2}$.

Example 6

The experiment in Example 5 was repeated in the same manner as in Example 1 except that methanol was replaced with hexane as a hydrocarbon, to give nearly the same results. Further, when monochromatic light of 340 nm was applied, 44% of light quantum (light photon) was used to generate electric current.

Example 7

(1) A Ga—In alloy was applied to a gallium arsenic n-type semiconductor (GaAs) single crystal (conductivity 11.5 Scm$^{-1}$) and then a copper wire was connected to form an Ohmic contact, whereby an anode electrode was obtained. As a counter cathode electrode, a platinum-black-coated platinum (area 1 cm$^2$ or more) was inserted, and the anode electrode and the cathode electrode were connected with a conducting wire to form an external circuit, whereby an electric cell was constituted.

(2) These electrodes were inserted in 5 ml of an aqueous solution containing 10 M ammonia and 0.1 M sodium sulfate electrolyte and white light (intensity 42 mWcm$^{-2}$) from a 500 W xenon lamp was applied. As photoelectric cell characteristics, the thus-obtained system showed an open photoelectromotive force (Voc) of 1 V, a short-circuit photoelectric current density (Jsc) of 10 mAcm$^{-2}$, a fill factor (FF) of 0.28 and an output (Wout) (Voc×Jsc×FF), as a photophysicochemical cell, of 2.8 mWcm$^{-2}$. The photoelectric conversion efficiency thereof was 6.7%. Per Coulomb number that flowed in a 3 hours' reaction, ammonia was nearly quantitatively decomposed to generate $N_2$, and oxygen was used up by 2-electron reduction. It has been thereby ascertained that ammonia can be quantitatively (100%) decomposed and that the (maximum) efficiency of energy conversion from ammonia to electric power is approximately 83%.

INDUSTRIAL UTILITY

In the photophysicochemical cell of the present invention, any fuel can be decomposed by oxidation with the photoanode without applying any auxiliary external energy unlike a conventional so-called photo-fuel cell, and at the counter cathode, oxygen is reduced, whereby a photoelectric current can be generated.

In the photophysicochemical cell of the present invention, not only those limited few compounds "having a current double effect" which are fuels for the so-called photo-fuel cell but also a wide range of compounds that naturally include alcohols such as methanol and also include urea, ammonia, agarose, glucose, amino acid and, further, biomass such as cellulose, livestock excrements and sewage can be used as fuels and decomposed to generate photoelectric current, so that the present invention has high industrial utility.

Further, the present invention has the following industrial utility.

The photophysicochemical cell of the present invention can be in principle used as a solar cell using sunlight, and further it can use water as a medium. Therefore, compounds that are incombustible, safe and have a high energy density, e.g., liquids like an ammonia aqueous solution or, further, water per se, can be used to constitute a photoelectric cell, and the photoelectric cell can be thus operated.

According to the present invention, further, electricity can be directly generated from human and animal excrements or waste that are presently disposed of by applying energy, while using them as a fuel for the above electric cell, and they can be also converted to environmental-pollution-free and safe compounds to put them back to the material circulation in the natural world.

According to the present invention, further, solids, slurries or solutions of various biomasses such as wood, plant leaves and stalks, cellulose, other polysaccharides proteins, starch, etc., can be used as a fuel for the electric power generator or generating system that directly convert them into electric power.

Furthermore, when the photophysicochemical cell of the present invention photolyzes various compounds, it generates photoelectric current depending upon the concentration thereof in a liquid, so that the concentration of such a compound can be easily measured by light on the basis of the value of the above photoelectric current. The photophysicochemical cell is hence suitably applicable or usable as a light sensor.

Furthermore, the photophysicochemical cell of the present invention generates electric power by simply providing an aqueous solution or waste liquid of any one of familiar various compounds (aqueous solutions of liquors (sake), wines, beers, milks, proteins, polysaccharides, etc., and extracts of fruits, flowers, plant leaves, etc.) and applying light thereto. The photophysicochemical cell is hence suitably applicable as a perfect educational tool or kit for teaching children and students the significance and importance of natural energy.

The invention claimed is:

1. A photophysicochemical cell which generates photoelectric current exclusively under applied light without application or inputting of any substantial external voltage and without application or inputting of pH chemical bias to the cell, comprising:
  (i) a liquid phase medium comprising an electron donor compound or an aqueous solution of an electron donor compound,
  (ii) a photoanode electrode formed of a porous semiconductor material and inserted in said liquid phase medium or said aqueous solution,
  (iii) a counter cathode electrode formed of an electrically conductive material capable of reducing oxygen and inserted in said liquid phase medium or said aqueous solution, and
  (iv) an external circuit connecting said anode electrode and said counter cathode electrode with an external conducting wire,
wherein
  (a) said liquid phase medium or said aqueous solution also comprises oxygen,
  (b) said porous semiconductor material functions as a porous electrically conductive material in an ultraviolet radiation,
  (c) said porous semiconductor material comprises a thin layer of a member selected from the group consisting of titanium dioxide ($TiO_2$) and zinc oxide (ZnO) on an electrically conductive substrate,
  (d) when light is applied to said photoanode electrode said electron donor compound is oxidatively photolyzed at said anode electrode and oxygen is reduced at said counter cathode electrode and a photoelectric current is generated in said external circuit, and
  (e) said photophysicochemical cell oxidatively photolyzes said electron donor compound and generates photoelectric current exclusively under applied light without application or inputting of any substantial external voltage and without application or inputting of pH chemical bias to the cell.

2. The photophysicochemical of claim 1, wherein said porous semiconductor material has a large effective surface area of some hundreds times to thousands times the apparent surface area of the photoanode electrode.

3. The photophysicochemical cell of claim 1, wherein an electrode whose surface is modified with an oxidation catalyst for water is used as said photoanode electrode and/or an oxidation catalyst for water is also being present in the liquid phase medium.

4. The photophysicochemical cell of claim 1, wherein a counter electrode whose surface is modified with a reduction catalyst for oxygen is used as said counter electrode and/or a reduction catalyst for oxygen is also being present in the liquid phase.

5. The photophysicochemical cell of claim 1, wherein a solution of biomass or a derivative thereof is used as said electron donor compound.

6. The photophysicochemical cell of claim 1, wherein said porous semiconductor material comprises a thin layer of a member selected from the group consisting of titanium dioxide ($TiO_2$) on an electrically conductive substrate.

7. The photophysicochemical cell of claim 1, wherein said porous semiconductor material comprises a thin layer of a member selected from the group consisting of zinc oxide (ZnO) on an electrically conductive substrate.

8. The photophysicochemical cell of claim 1, wherein said electron donor compound comprises at least one member selected from the group consisting of urea, alcohols, hydrocarbons, organic acids, organic esters, ketones, and ethers, amines, acid amides, saccharides, polysaccharides, and metal salts.

9. The photophysicochemical cell of claim 1, wherein said electron donor compound comprises at least one member selected from the group consisting of ammonia, water, methanol, ethanol, isopropanol, butanol, hexanol, heptanol, glycerin, polyethylene glycol, polypropylene glycol, methane, ethane, propane, butane, pentane, hexane, benzene, toluene, xylene, aniline, anthracene, formic acid, acetic acid, propionic acid, butyric acid, caproic acid, acrylic acid, crotonic acid, oleic acid, methylamine, ethylamine, phenylalanine, glutamic acid, aspartic acid, glycin, tyrosine, glucose, sucrose, carrageenan, starch, cellulose, chitin, chitosan, gelatin and collagen.

10. The photophysicochemical cell of claim 1, wherein said liquid phase medium further comprises a compound capable of being decomposed to oxygen.

11. The photophysicochemical cell of claim 1, which further comprises at least one of an oxidation catalyst, sensitizer and reduction catalyst.

12. The photophysicochemical cell of claim 1, wherein the counter cathode electrode comprises platinum, silver oxide, carbon, porous carbon or graphite.

13. A method of generating a photoelectric current, comprising applying light to the photophysicochemical cell of claim 1.

14. The method of claim 13, wherein the light is applied without application or inputting of any substantial external voltage and without application or inputting of pH chemical bias to the cell.

15. A photophysicochemical cell which generates photoelectric current exclusively under applied light, comprising:
(i) a liquid phase medium comprising an electron donor compound or an aqueous solution of an electron donor compound in a container,
(ii) a photoanode electrode formed of a porous semiconductor material and inserted in said liquid phase medium or said aqueous solution in said container,
(iii) a counter cathode electrode formed of an electrically conductive material capable of reducing oxygen and inserted in said liquid phase medium or said aqueous solution in said container, and
(iv) an external circuit connecting said anode electrode and said counter cathode electrode with an external conducting wire,
wherein
(a) said liquid phase medium or said aqueous solution also comprises oxygen,
(b) said porous semiconductor material functions as a porous electrically conductive material in an ultraviolet radiation,
(c) said porous semiconductor material comprises a thin layer of a member selected from the group consisting of titanium dioxide ($TiO_2$) and zinc oxide (ZnO) on an electrically conductive substrate,
(d) when light is applied to said photoanode electrode said electron donor compound is oxidatively photolyzed at said anode electrode and oxygen is reduced at said counter cathode electrode and a photoelectric current is generated in said external circuit, and
(e) said photoanode and said counter cathode electrode both are inserted in said liquid phase medium or said aqueous solution in said container.

16. The photophysicochemical of claim 15, wherein said porous semiconductor material has a large effective surface area of some hundreds times to thousands times the apparent surface area of the photoanode electrode.

17. The photophysicochemical cell of claim 15, wherein said electron donor compound comprises at least one member selected from the group consisting of urea, alcohols, hydrocarbons, organic acids, organic esters, ketones, and ethers, amines, acid amides, saccharides, polysaccharides, and metal salts.

18. The photophysicochemical cell of claim 1, wherein said electron donor compound comprises at least one member selected from the group consisting of water, ammonia, methanol, ethanol, isopropanol, butanol, hexanol, heptanol, glycerin, polyethylene glycol, polypropylene glycol, methane, ethane, propane, butane, pentane, hexane, benzene, toluene, xylene, aniline, anthracene, formic acid, acetic acid, propionic acid, butyric acid, caproic acid, acrylic acid, crotonic acid, oleic acid, methylamine, ethylamine, phenylalanine, glutamic acid, aspartic acid, glycin, tyrosine, glucose, sucrose, carrageenan, starch, cellulose, chitin, chitosan, gelatin and collagen.

19. A method of generating a photoelectric current, comprising applying light to the photophysicochemical cell of claim 15.

20. The method of claim 19, wherein the light is applied without application or inputting of any substantial external voltage and without application or inputting of pH chemical bias to the cell.

21. The photophysicochemical cell of claim 15, wherein said photophysicochemical cell oxidatively photolyzes said electron donor compound and generates photoelectric current exclusively under applied light without application or inputting of any substantial external voltage and without application or inputting of pH chemical bias to the cell.

* * * * *